(12) United States Patent
Javorka et al.

(10) Patent No.: US 9,349,734 B2
(45) Date of Patent: May 24, 2016

(54) SELECTIVE FUSI GATE FORMATION IN GATE FIRST CMOS TECHNOLOGIES

(71) Applicant: GLOBALFOUNDRIES Inc., Grand Cayman (KY)

(72) Inventors: Peter Javorka, Radeburg (DE); Stefan Flachowsky, Dresden (DE); Gerd Zschätzsch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/475,720

(22) Filed: Sep. 3, 2014

(65) Prior Publication Data

US 2016/0064382 A1    Mar. 3, 2016

(51) Int. Cl.

| | | |
|---|---|---|
| H01L 21/336 | (2006.01) | |
| H01L 27/092 | (2006.01) | |
| H01L 29/78 | (2006.01) | |
| H01L 29/49 | (2006.01) | |
| H01L 29/66 | (2006.01) | |
| H01L 21/8238 | (2006.01) | |
| H01L 21/02 | (2006.01) | |
| H01L 21/308 | (2006.01) | |
| H01L 21/311 | (2006.01) | |
| H01L 27/06 | (2006.01) | |

(52) U.S. Cl.
CPC ...... *H01L 27/0922* (2013.01); *H01L 21/02532* (2013.01); *H01L 21/308* (2013.01); *H01L 21/31105* (2013.01); *H01L 21/8238* (2013.01); *H01L 21/823814* (2013.01); *H01L 21/823835* (2013.01); *H01L 27/0629* (2013.01); *H01L 29/4975* (2013.01); *H01L 29/665* (2013.01); *H01L 29/6656* (2013.01); *H01L 29/66545* (2013.01); *H01L 29/7848* (2013.01)

(58) Field of Classification Search
CPC ............... H01L 21/8238; H01L 21/82314; H01L 21/823835; H01L 21/02532; H01L 21/308; H01L 29/66545; H01L 29/6656; H01L 21/31105; H01L 27/0629; H01L 27/0922; H01L 29/7848; H01L 29/4975; H01L 21/82307; H01L 21/82342
USPC .......................................................... 438/199
See application file for complete search history.

(56) References Cited

U.S. PATENT DOCUMENTS

| 8,293,631 | B2* | 10/2012 | Dyer | H01L 21/823807 257/413 |
| 9,142,547 | B2* | 9/2015 | Stahrenberg | H01L 27/0629 |
| 2009/0065807 | A1* | 3/2009 | Fujimoto | H01L 21/823807 257/190 |
| 2014/0248761 | A1* | 9/2014 | Park | H01L 21/823871 438/586 |

\* cited by examiner

*Primary Examiner* — Savitr Mulpuri
(74) *Attorney, Agent, or Firm* — Amerson Law Firm, PLLC

(57) ABSTRACT

The present disclosure provides a method of forming a semiconductor device structure with selectively fabricating semiconductor device structures having fully silicided (FuSi) gates and partially silicided gates. In aspects of the present disclosure, a semiconductor device structure with a first semiconductor device and a second semiconductor device is provided, wherein each of the first and second semiconductor devices includes a gate structure over an active region, each of the gate structures having a gate electrode material and a gate dielectric material. The gate electrode material of the first semiconductor device is recessed, resulting in a recessed first gate electrode material which is fully silicided during a subsequent silicidation process. On the gate electrode material of the second semiconductor device, a silicide portion is formed during the silicidation process.

18 Claims, 4 Drawing Sheets

SELECTIVE FUSI GATE FORMATION IN GATE FIRST CMOS TECHNOLOGIES

BACKGROUND OF THE INVENTION

1. Field of the Invention

The present disclosure generally relates to gate first technologies and herein to the selective fabrication of FuSi gates in CMOS technologies. In particular, the present disclosure relates to a method of forming a semiconductor device structure having two semiconductor devices, one with a FuSi gate and the other with a partially silicided gate, and to an according semiconductor device structure.

2. Description of the Related Art

In modern electronic equipment, integrated circuits (ICs) experience a vast applicability in a continuously spreading range of applications. Particularly, the demand for increasing mobility of electronic devices at high performance and low energy consumption drives developments to more and more compact devices having features with sizes ranging even into the deep sub-micron regime; the more so as current semiconductor technologies are apt of producing structures with dimensions in the magnitude of 10 nm. With ICs representing a set of electronic circuit elements integrated on a semiconductor material, normally silicon, ICs may be made much smaller than discreet circuits composed of independent circuit components. The majority of present-day ICs are implemented by using a plurality of circuit elements, such as field effect transistors (FETs), also called metal oxide semiconductor field effect transistors (MOSFETs or simply MOS transistors) and passive elements, such as resistors and capacitors, integrated on a semiconductor substrate with a given surface area. Typically, present-day integrated circuits involve millions of single circuit elements formed on a semiconductor substrate.

The basic function of a MOSFET is that of an electronic switching element, wherein a current through a channel region between two contact regions, referred to as source and drain, is controlled by a gate electrode to which a voltage relative to source and drain is applied. Particularly, in applying a voltage exceeding a characteristic voltage level to the gate electrode, the conductivity state of a MOSFET is changed and the characteristic voltage level, usually called "threshold voltage" and in the following referred to as Vt, characterizes the switching behavior of a MOSFET. In general, Vt depends nontrivially on the transistor's properties, e.g., materials, dimensions etc., such that the implementation of a desired Vt involves plural steps of adjustment and fine-tuning during the fabrication process.

Metal gates have been realized in two general approaches: gate first and gate last. The former approach retains the order of standard polysilicon gate process flows and its main disadvantages are concerns about contamination of front end tools during processing, particularly furnaces, difficult metal etching, and the integrity of the gate stack during high temperature anneals. The gate last approach is also called a replacement gate technique, where a dummy gate is removed after all doping and high temperature processes are completed. Its main challenge is the dummy gate stack removal and replacement.

The most common digital integrated circuits built today use CMOS logic, which is fast and offers a high circuit density and a low power consumption. CMOS or "complementary symmetry metal oxide semiconductor," as it is sometimes referred to, makes use of complementary and symmetrical pairs of P-type and N-type MOSFETs for implementing logic functions. Two important characteristics of CMOS devices are the high noise immunity and low static power consumption of a CMOS device because the series combination of complementary MOSFETs in a CMOS device draws significant power only momentarily during switching between ON- and OFF-states, since one transistor of a CMOS device is always in the OFF-state. Consequently, CMOS devices do not produce as much waste heat as other forms of logic, for example, transistor-transistor logic (TTL) or NMOS logic, which normally have some standing current even when not changing state.

Full silicidation (FuSi) of polysilicon gates is used for the formation of metal gate electrodes of highly scaled CMOS transistors. A common material employed in the formation of silicide is represented by nickel, wherein nickel silicide was shown to produce different work functions, covering a large portion of silicon band gap, in relation to a dopant type and amount present in polysilicon gates.

High performance CMOS technologies generally require two separate work functions for NMOS and PMOS devices. A technique for forming tunable metal gates uses the full silicidation of doped polysilicon gates, which turns out to be relatively simple. Full silicidation is achieved when a sufficient amount of nickel is deposited on a polysilicon gate and all the polysilicon is consumed during a subsequently-performed annealing process resulting in nickel silicide. The accordingly-obtained FuSi structure has substantially different electrical characteristics from the initial polysilicon gate device.

FuSi gates in gate first technology are known to improve the DC performance of PMOS devices, according to present understanding, due to the intrinsic tensile stress of the formed silicide. However, a degradation of NMOS devices with FuSi gates in their performance by about 10% is observed and, accordingly, CMOS devices with FuSi gates show degraded performance.

In the framework of 28 nm high-k/metal gate processes and beyond (22 nm, etc.) in gate first techniques, it is, therefore, desirable to increase the performance of semiconductor device structures.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides a method of forming a semiconductor device structure with selectively fabricating semiconductor device structures having fully silicided (FuSi) gates and partially silicided gates.

In a first aspect of the present disclosure, a method of forming a semiconductor device structure is provided. In accordance with illustrative embodiments herein, the method includes providing a first semiconductor device with a first gate structure over a first active region formed in a semiconductor substrate, wherein the first gate structure comprises a first gate electrode material and a first gate dielectric material, and providing a second semiconductor device with a second gate structure over a second active region formed in the semiconductor substrate, the second gate structure comprising a second gate electrode material and a second gate dielectric material. The method further includes recessing the first gate electrode material, leaving a recessed first gate electrode material. On the first gate dielectric material, a first silicide portion is formed by siliciding the recessed first gate electrode material. A second silicide portion is formed by siliciding a portion of the second gate electrode material.

In a second aspect of the present disclosure, a method of forming a semiconductor device structure is provided. In some illustrative embodiments herein, the method includes providing a first semiconductor device with a first gate structure over a first active region formed in a semiconductor substrate, the first gate structure comprising a first gate electrode material in a first gate dielectric material, providing a second semiconductor device with a second gate structure over a second active region formed in the semiconductor substrate, the second gate structure comprising a second gate electrode material and a second gate dielectric material, applying a selective anisotropic etch process to the first semiconductor device, wherein the first gate electrode material is recessed such that a recessed first gate electrode material is left and a cavity structure is formed in alignment with a first gate structure in the first active region during the selective anisotropic etch process, performing a deposition process for depositing a strain-inducing material in the cavity structure, forming a first silicide portion on the first gate dielectric material by siliciding the recessed first gate electrode material, and forming a second silicide portion by siliciding a portion of the second gate electrode material.

In a third aspect of the present disclosure, a semiconductor device structure is provided. In some illustrative embodiments herein, the semiconductor device structure includes a first semiconductor device with a first active region formed in a semiconductor substrate in a first gate structure disposed over the first active region, the first gate structure having a fully silicided gate electrode, and a second semiconductor device with a second active region formed in the semiconductor substrate and a second gate structure disposed over the second active region, the second gate structure having a partially silicided gate electrode.

BRIEF DESCRIPTION OF THE DRAWINGS

The disclosure may be understood by reference to the following description taken in conjunction with the accompanying drawings, in which like reference numerals identify like elements, and in which.

Figure 1:
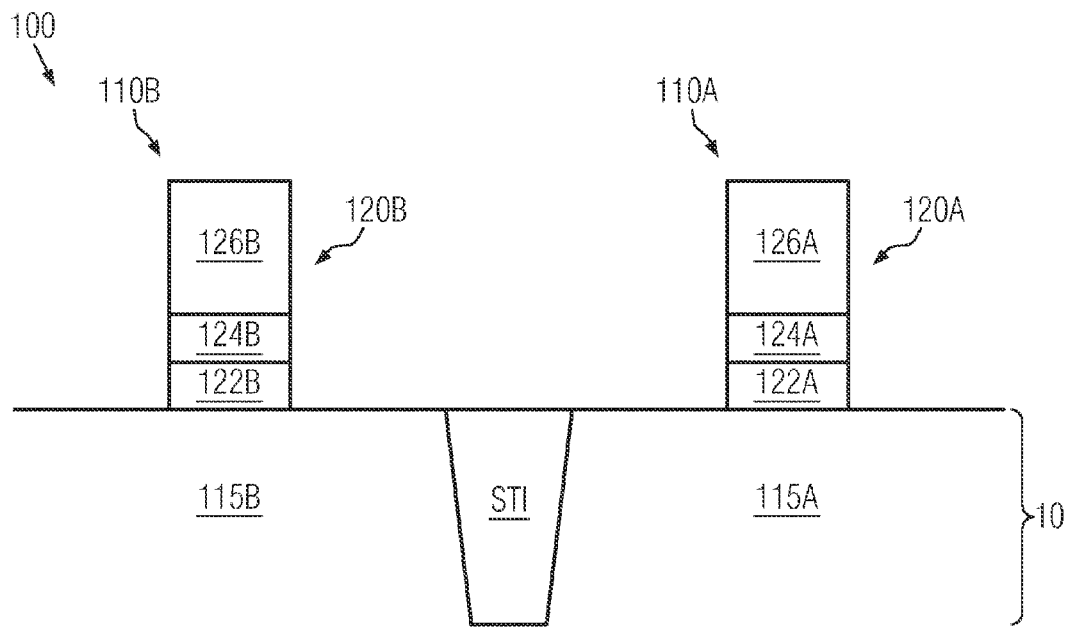
FIGS. 1-7 schematically show a process in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor circuit elements comprising semiconductor devices that are integrated on or in a chip, such as FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor circuit elements of the present disclosure, and particularly semiconductor devices as illustrated by means of some illustrative embodiments, concern elements and devices which are fabricated by using advanced technologies. Semiconductor circuit elements of the present disclosure are fabricated by technologies applied to approach technology nodes smaller than 100 nm, for example, smaller than 50 nm or smaller than 35 nm. The person skilled in the art will appreciate that the present disclosure suggests semiconductor circuit elements having structures with minimal length and/or width dimensions smaller than 100 nm, for example, smaller than 50 nm or smaller than 35 nm.

The person skilled in the art understands that semiconductor devices may be fabricated as MOS devices, such as P-channel MOS transistors or PMOS transistors and N-channel transistors or NMOS transistors, and both may be fabricated with or without mobility-enhancing stressor features or strain-inducing features. A circuit designer can mix and match device types, using PMOS and NMOS devices, stressed and unstressed, to take advantage of the best characteristics of each device type as they best suit the semiconductor circuit element being designed.

FIG. 1 shows schematically, in a cross-sectional view, a portion of a semiconductor device structure 100 during front end of line (FEOL) processing. Particularly, the semiconductor device structure 100 comprises a semiconductor device 110A and a semiconductor device 110B. Herein, the semiconductor device 110A corresponds to the first semiconductor device as described above and the semiconductor device 110B corresponds to the second semiconductor device as described above.

The semiconductor device 110A comprises a gate structure 120A disposed over an active region 115A provided within a semiconductor substrate 10. The semiconductor substrate may be, for example, a bulk substrate or may represent an active layer of a silicon-on-insulator (SOI) substrate or silicon/germanium on insulator (SGOT) substrate. In general, the terms "substrate," "semiconductor substrate" or "semiconducting substrate" should be understood to cover all semiconductor materials and all forms of such semiconductor materials and no limitation to a special kind of substrate is intended.

The gate structure 120A comprises a gate dielectric 122A disposed on an upper surface of the active region 115A and a work function adjusting material 124A formed on the gate dielectric 122A. A gate electrode material 126A is formed over the gate dielectric 122A and on the work function adjusting material 124A.

In some illustrative examples of the present disclosure, the gate dielectric 122A may comprise one or more high-k dielectric materials, such as hafnium oxide, hafnium silicon oxynitride and the like. The person skilled in the art will appreciate that the gate dielectric 122A may be composed of one or more layers of dielectric materials with k lower than 4 and/or high-k dielectric materials. For example, the gate dielectric 122A may comprise an $SiO_2$ layer formed on an upper surface of the active region 115A and one or more high-k material layers disposed on the $SiO_2$ layer.

Illustrative materials for adjusting the work function are provided by at least one of doped hafnium oxide, $Al_2O_3$ and LaO.

The semiconductor device 110B is positioned adjacent to the semiconductor device 110A, wherein the active region 115A is separated from an active region 115B of the semiconductor device 110B by means of a shallow trench isolation region STI which is formed between the active regions 115A, 115B. However, this does not pose any limitation to the present disclosure and the person skilled in the art will appreciate that, alternatively, one or more further semiconductor devices may be present in between the semiconductor devices 110A and 110B.

The semiconductor device 110B comprises a gate structure 120B. The gate structure 120B comprises a gate dielectric 122B disposed on an upper surface of the active region 115B and a work function adjusting material 124B formed on the gate dielectric 122B. A gate electrode material 126B is formed over the gate dielectric 122B and on the work function adjusting material 124B.

In some illustrative examples of the present disclosure, the gate dielectric 122B may comprise one or more high-k dielectric materials, such as hafnium oxide, hafnium silicon oxynitride and the like. The person skilled in the art will appreciate that the gate dielectric 122B may be composed of one or more layers of dielectric materials with k lower than 4 and/or high-k dielectric materials. For example, the gate dielectric 122B may comprise an $SiO_2$ layer formed on an upper surface of the active region 115B and one or more high-k material layers disposed on the $SiO_2$ layer.

The semiconductor device structure 100 as illustrated in FIG. 1 may be obtained by conventional techniques for forming gate structures of planar MOS devices. For example, after having formed STI regions within the semiconductor substrate 10, a stack of layers may be deposited over the semiconductor substrate 10. On the deposited layers, a masking pattern may be formed by, for example, depositing a resist and appropriately patterning the resist by known technologies, such as photolithography and the like. With appropriate masking patterns and etch techniques, the gate structures 120A and 120B may be formed. These techniques are known in the art and details are omitted for the sake of brevity.

Figure 2:
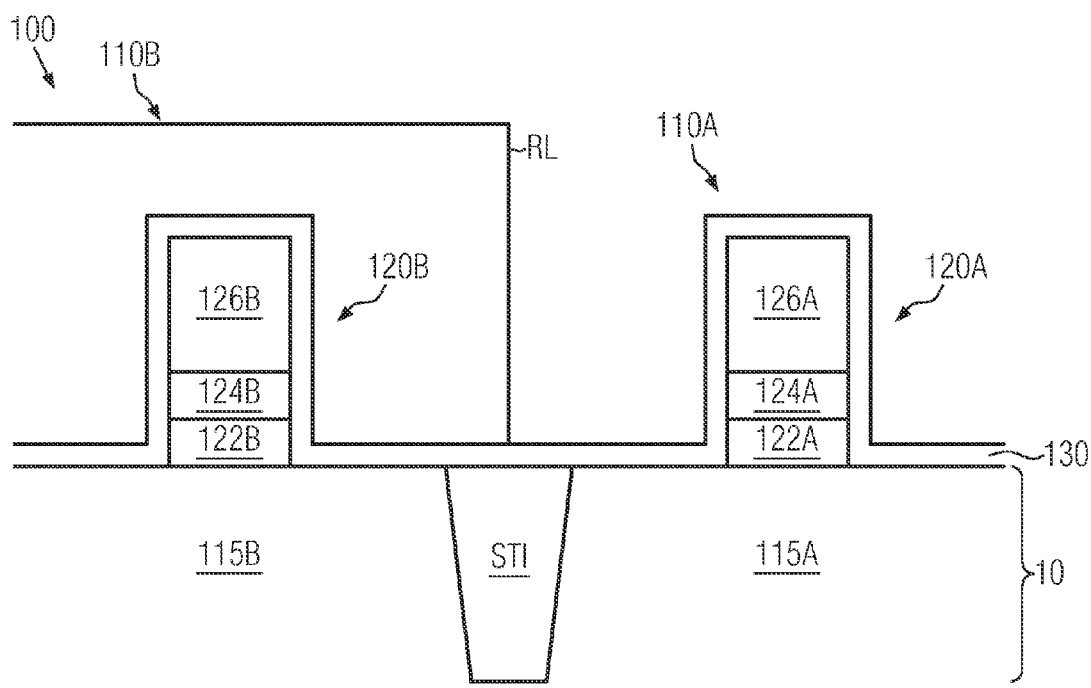

FIG. 2 schematically illustrates the semiconductor device structure 100 at a more advanced stage during FEOL processing. As illustrated in FIG. 2, an insulating material layer 130 is formed over the first and second semiconductor devices 110A and 110B. In accordance with special illustrative embodiments of the present disclosure, the insulating material layer 130 may be, for example, blanket-deposited over the semiconductor device structure 100. In accordance with some examples of the present disclosure, the insulating material layer 130 may be formed by one of silicon nitride and silicon oxide. In some special examples, the insulating material layer 130 may represent a hard mask layer.

Referring to FIG. 2, a patterned resist layer RL is formed over the semiconductor device structure 100, wherein the patterned resist layer RL is patterned such that the semiconductor device 110A is exposed to further processing, while the semiconductor device 110B is covered by the resist layer RL. Accordingly, the semiconductor device 110B is protected from further processing by the insulating material layer 130 and the resist layer RL. In accordance with some illustrative embodiments of the present disclosure, the resist layer RL may be a photoresist which is patterned by photolithography.

Figure 3:
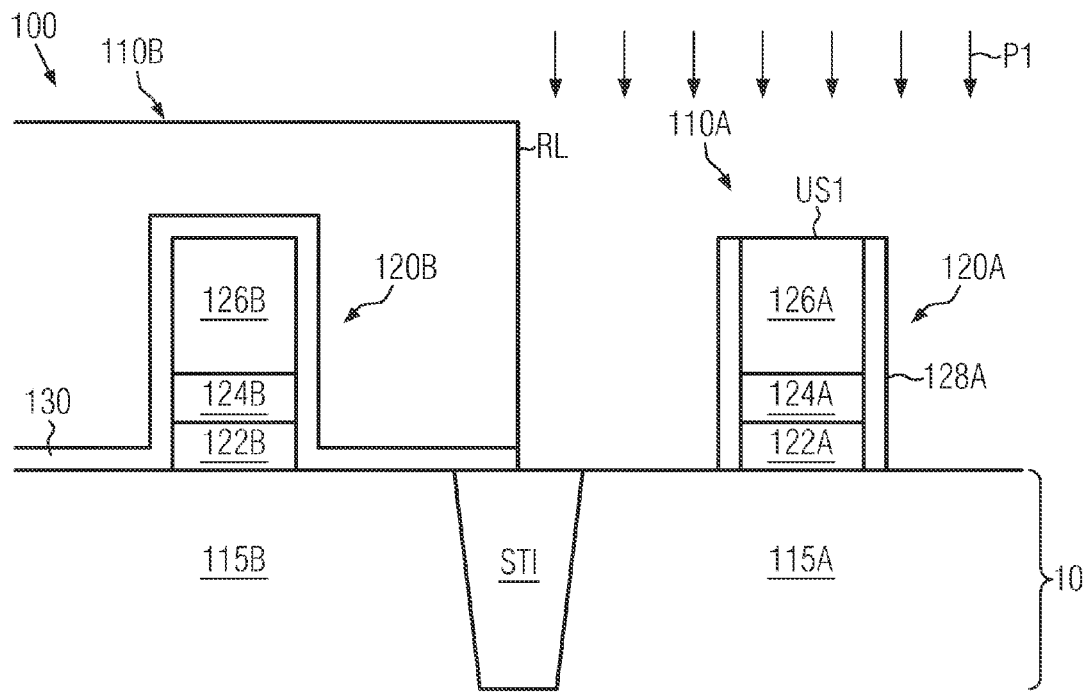

FIG. 3 schematically illustrates the semiconductor device structure 100 in a cross-sectional view during processing at a more advanced stage in the process flow. Particularly, the semiconductor device 110A is depicted after a spacer-forming process (not illustrated) is completed and sidewall spacers 128A are formed adjacent to the gate structure 120A. The spacer-forming process (not illustrated) may be an anisotropic etch process applied to the insulating material layer 130 which is exposed over the active region 115A. As a result of the spacer-forming process (not illustrated), an upper surface US1 of the gate electrode material 126A is exposed, i.e., not covered by any material of the insulating material layer 130 and no cap layer is formed on the gate electrode material 126A. In this way, a masking pattern, represented by the remaining insulating material layer 130 covering the semiconductor device 110B and the resist layer RL, is formed. The masking pattern covers the semiconductor device 110B, which is, therefore, protected from further processing, while the semiconductor device 110A is exposed to further processing.

As illustrated in FIG. 3, a process P1 is applied to the semiconductor device structure 100, and particularly to the semiconductor device 110A, while the semiconductor device 110B is protected by the masking pattern represented by 130 and RL. In accordance with some illustrative embodiments of the present disclosure, the process P1 is a selective anisotropic etch process. For example, the process P1 may comprise an anisotropic wet etch process with KOH or NaOH or LiOH or EDP or TMAH. Alternatively, a dry etch process, e.g., RIE, may be employed.

Figure 4:
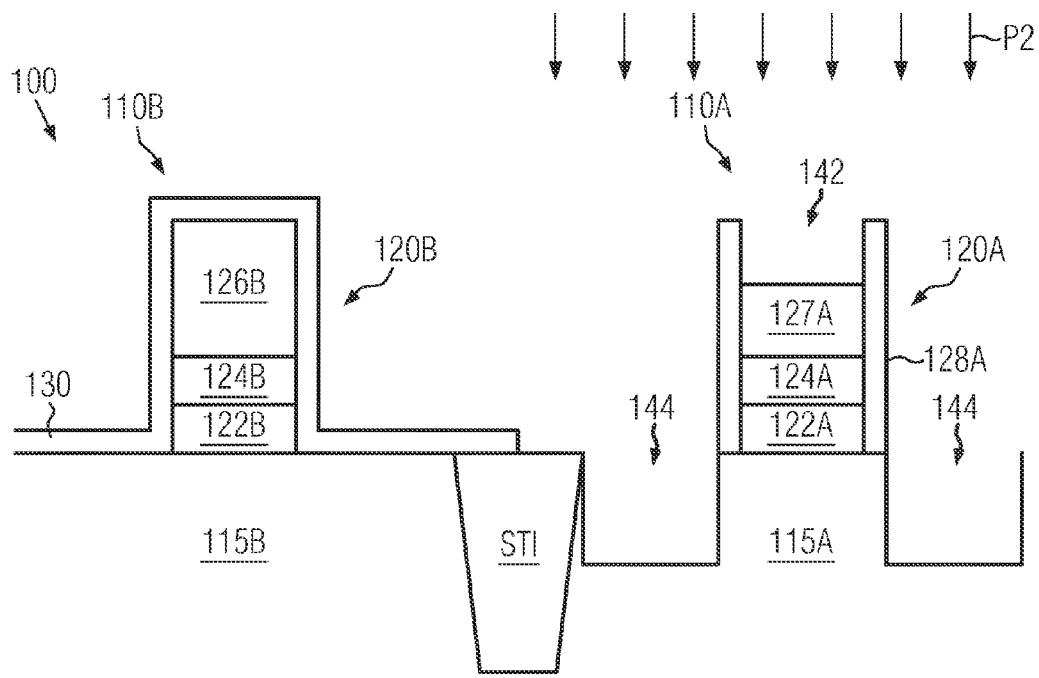

Referring to FIG. 4, the resist layer RL is subsequently removed such that the insulating material layer 130 disposed on the semiconductor device 110B is exposed.

FIG. 4 schematically illustrates the semiconductor device structure 100 after the process P1 is terminated and when a process P2 is to be applied. Particularly, as a result of the process P1, the semiconductor material of the active region 115A and of the gate electrode material 126A (see FIG. 3) is recessed such that a cavity structure 144 is formed within the active region 115A in alignment with the gate structure 120A and particularly in alignment with the sidewall spacers 128A. At the same time, a gate recess 142 is formed by recessing the gate electrode material 126A during the process P1, leaving a leftover of the gate electrode material 126A as remaining gate electrode material 127A.

After completion of the process P1 and removal of the resist layer RL (prior to or after P1), the deposition process P2 is performed. The deposition process P2 is a selective deposition process for depositing strain-inducing material. In some special examples herein, the strain-inducing material may be silicon/germanium. Alternatively, doped silicon is grown instead of a strain-inducting material for forming source and drain regions within the cavities 144.

Accordingly, the deposition process P2 is applied to the semiconductor device 110A, while the semiconductor device 110B is protected by the insulating material layer 130 during the application of the deposition process P2. In some illustrative embodiments of the present disclosure, the deposition process P2 comprises an epitaxial deposition process for epitaxially growing strain-inducing material on exposed surfaces of the cavities 144.

In accordance with an illustrative embodiment, the deposition process P2 is configured such that a deposition rate of strain-inducing material on material of the active region 115A, i.e., relative to the material of the semiconductor substrate 10, is substantially positive, while a deposition rate of strain-inducing material on the remaining gate electrode material 127A is at most zero, if not negative. In a special example herein, the deposition process P2 comprises one or more deposition and etch cycles ("cyclic/deposition etch or CDE"). For example, the remaining gate electrode material 127A is provided by amorphous silicon. In appropriately selecting the parameters of the deposition process of silicon/germanium, substantially no silicon/germanium is grown in the gate cavity 142 and the silicon/germanium is substantially grown in the cavity structure 144. In case that the deposition rate of silicon/germanium on the remaining gate electrode material 127A is smaller than a deposition rate of silicon/germanium on material of the semiconductor substrate 10, deposition and etch cycles for depositing silicon/germanium and etching silicon/germanium results in a net deposition of silicon/germanium in the cavity structure 144 only.

Figure 5:
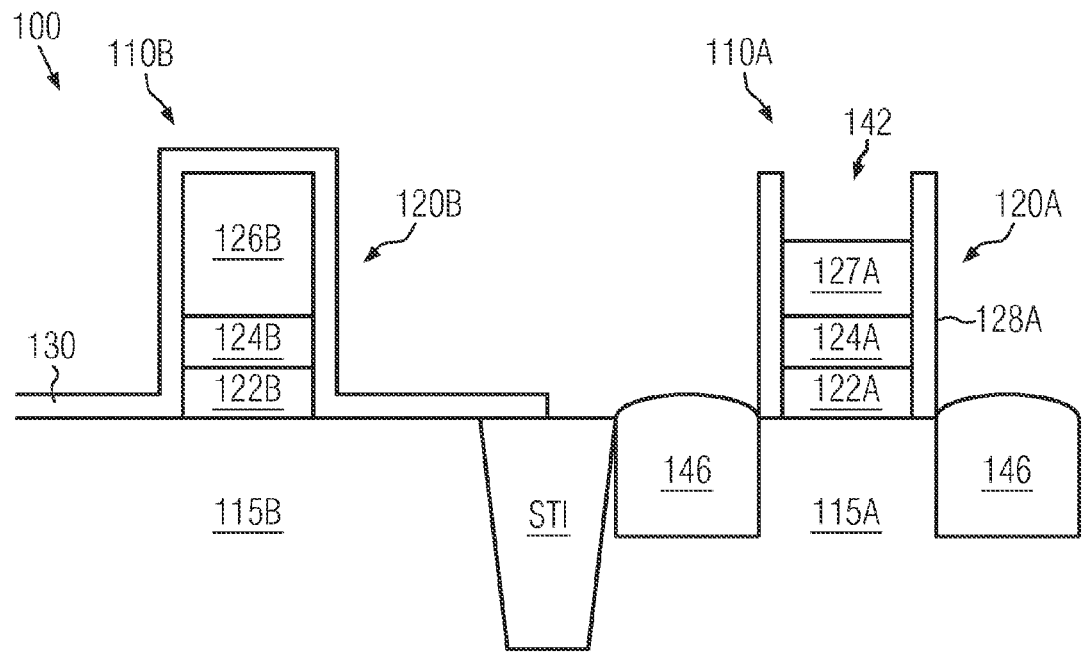

FIG. 5 schematically illustrates the semiconductor device structure 100 at a more advanced stage during fabrication, particularly after the deposition process P2 is completed. The cavity structure 144 (see FIG. 4) is filled up or overfilled by the deposited strain-inducing material such that strain-inducing regions 146 are formed in the active region 115A in alignment with the gate structure 120A. Alternatively, doped source/drain regions are formed in the process P2 as described above.

Figure 6:
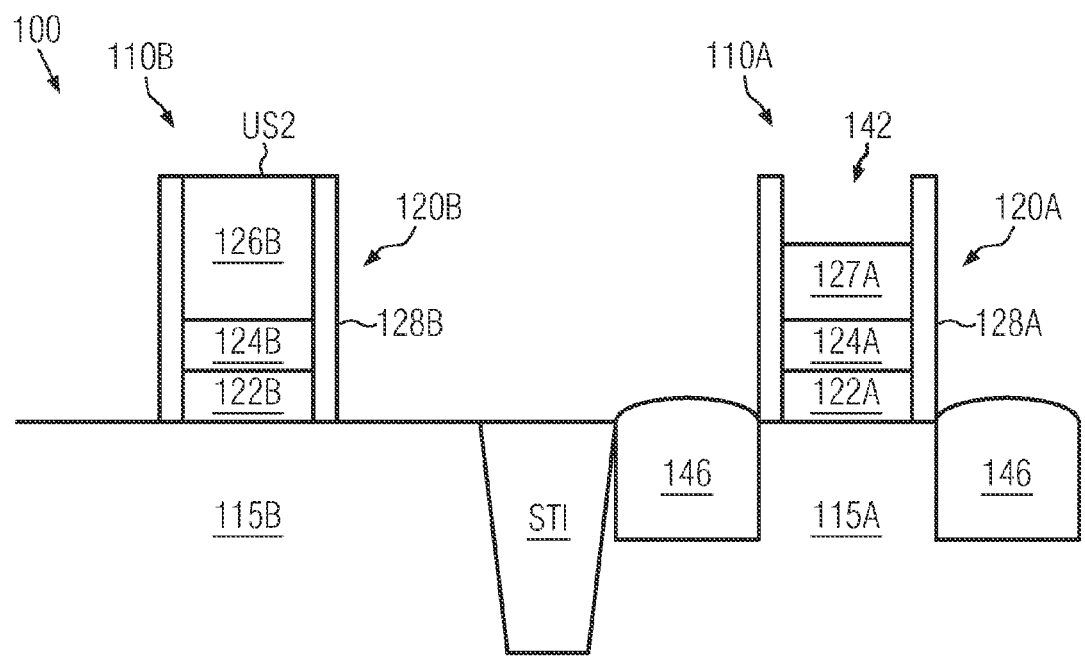

FIG. 6 schematically illustrates the semiconductor device structure at a more advanced stage during fabrication, particularly after a spacer-forming process has been applied to the semiconductor device 110B. Although the details of the spacer-forming process are omitted for brevity, it is noted that a sidewall spacer 128B of the semiconductor device 110B may be formed by forming an appropriate masking pattern over the semiconductor device structure 100 such that the semiconductor device 110A is covered, while the semiconductor device 110B is exposed to further processing. In applying a spacer-forming process similar to the above-described spacer-forming process employed for forming the spacer 128A, the insulating material layer 130 formed on the semiconductor device 110B is shaped, thereby resulting in the sidewall spacer 128B. After removing the masking pattern (not illustrated), the semiconductor device structure 100 of FIG. 6 is obtained.

Subsequently to the stage illustrated in FIG. 6, a metal layer may be deposited over the semiconductor device structure 100 (not illustrated), e.g., a blanket deposition of a metal, such as nickel, may be performed. In applying an annealing process (not illustrated), metal material deposited on semiconductor material forms an alloy ("silicide") with the semiconductor material, while metal material deposited on insulating material, such as the sidewall spacers 128A and 128B, does not form a silicide. Therefore, after removing the metal material in a selective etch process relative to the formed silicide material, the semiconductor device structure as illustrated in FIG. 7 is obtained.

Figure 7:
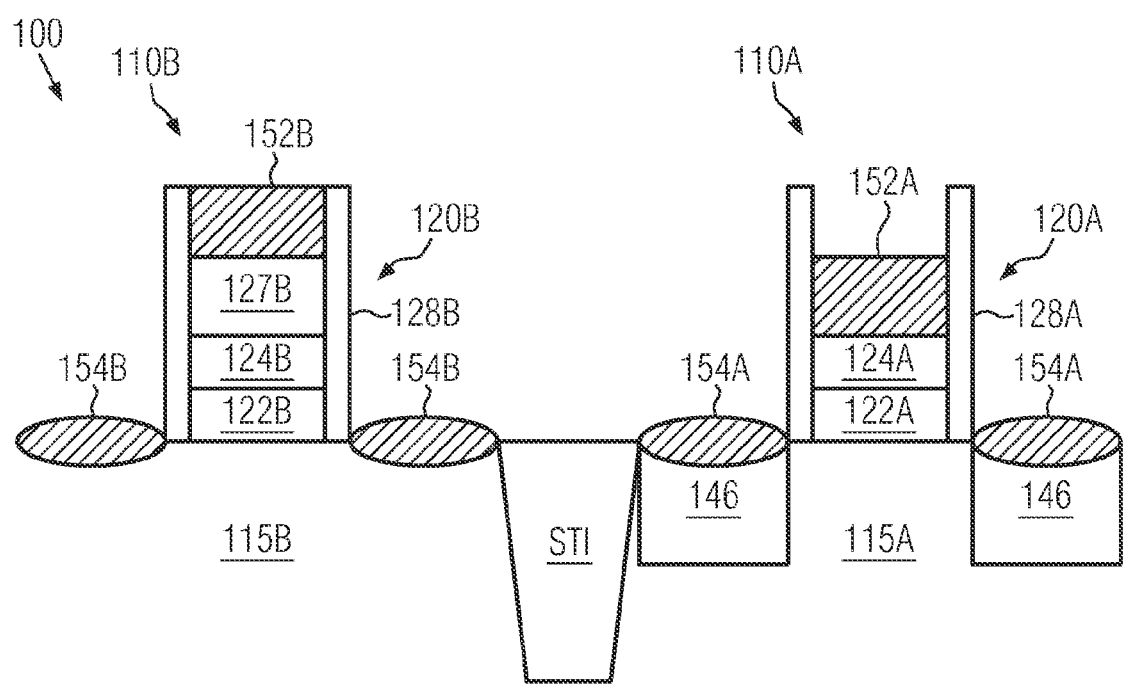

Referring to FIG. 7, the semiconductor device structure 100 is schematically illustrated after the above-described silicidation process is completed and silicide regions 152A and 152B are formed in the respective gate structure 120A and 120B, while silicide regions 154A and 154B are formed in the respective active regions 115A and 115B. Particularly, a fully silicided (FuSi) gate 120A is obtained because the silicide region 152A is formed by metal material consuming the remaining gate electrode material 127A (see FIG. 6) such that the silicide region 152A is formed directly on and in contact with the work function adjusting material 124A and the gate dielectric 122A. On the other hand, the silicide region 152B is disposed on remaining material of the gate electrode material 127B (gate electrode material that is left from the gate electrode material 126B (see FIG. 6), i.e., not consumed by metal material during the silicidation). Therefore, the semiconductor device 110A has a gate structure 120A which has the FuSi gate structure 120A, while the gate structure 120B of the semiconductor device 110B is only partially silicided.

The process flow may continue from here on in accordance with standard processes.

In accordance with some special examples of the present disclosure, the semiconductor device 110A may represent a PMOS device, while the semiconductor device 110B may represent an NMOS device. The person skilled in the art will appreciate that herein the AC performance (ring oscillator speed) is improved by fixing the NMOS degradation in the semiconductor device 110B, while the full ring oscillator speed benefit of the FuSi gate process is implemented for the PMOS of semiconductor device 110A. According to measurements conducted by the inventors, an improvement in the AC performance of up to 20% as compared to conventional CMOS structures having either fully silicided NMOS and PMOS devices or partially silicided NMOS device and PMOS device, is achieved. In summary, the present disclosure proposes, in some illustrative embodiments, a method for fabricating a selective FuSi gate in CMOS process flows, in which NMOS devices use partially silicided gate structures, while PMOS devices have FuSi gates and, therefore, benefit from increased DC and AC performance.

In summary, the present disclosure provides a method of forming a semiconductor device structure with selectively fabricating semiconductor device structures having fully silicided (FuSi) gates and partially silicided gates. In aspects of the present disclosure, a semiconductor device structure with a first semiconductor device and a second semiconductor device is provided, wherein each of the first and second semiconductor devices comprises a gate structure over an active region, each of the gate structures having a gate electrode material and a gate dielectric material. The gate electrode material of the first semiconductor device is recessed, resulting in a recessed first gate electrode material which is fully silicided during a subsequent silicidation process. On the gate electrode material of the second semiconductor device, a silicide portion is formed during the silicidation process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of forming a semiconductor device structure, comprising:
providing a first semiconductor device with a first gate structure over a first active region formed in a semiconductor substrate, said first gate structure comprising a first gate electrode material and a first gate dielectric material;
providing a second semiconductor device with a second gate structure over a second active region formed in said semiconductor substrate, said second gate structure comprising a second gate electrode material and a second gate dielectric material;
forming a pattern masking layer over said semiconductor structure that exposes said first semiconductor device and covers said second semiconductor device;
with the pattern masking layer in position, performing a selective anisotropic etch process to said first semiconductor device to recess said first gate electrode material, thereby leaving a recessed first gate electrode material, and to form
a cavity structure in said first active region, said cavity structure being in alignment with said first gate structure;
with the pattern masking layer in position, performing a deposition process to deposit a strain-inducing material in said cavity structure;
removing the pattern masking layer;
forming a first silicide portion on and in contact with said first gate dielectric material by siliciding all of said recessed first gate electrode material; and
forming a second silicide portion on and in contact with a portion of said second gate electrode material.

2. The method of claim 1, wherein said deposition process comprises one or more deposition and etch cycles.

3. The method of claim 2, wherein said deposition process is configured such that the growth rate of silicon/germanium after each deposition and etch cycle is positive on said cavity structure and negative on said first gate electrode material.

4. The method of claim 1, wherein said first gate electrode material comprises amorphous silicon material.

5. The method of claim 1, further comprising forming an insulating material layer on said first and second semiconductor devices prior to recessing said first gate electrode material, said insulating material layer being directly formed on said first and second gate structures.

6. The method of claim 5, further comprising applying an anisotropic etch process to said insulating material layer for forming sidewall spacers to said first gate structure from said insulating material layer and exposing an upper surface of said first gate electrode material before recessing said first gate electrode material.

7. The method of claim 6, wherein said insulating material layer on said second semiconductor device is protected from being exposed to said anisotropic etch process.

8. The method of claim 1, wherein said semiconductor device structure represents a CMOS structure with a PMOS device forming said first semiconductor device and an NMOS device forming said second semiconductor device.

9. A method of forming a semiconductor device structure, comprising:
providing a first semiconductor device with a first gate structure over a first active region formed in a semiconductor substrate, said first gate structure comprising a first gate electrode material and a first gate dielectric material;
providing a second semiconductor device with a second gate structure over a second active region formed in said semiconductor substrate, said second gate structure comprising a second gate electrode material and a second gate dielectric material;
applying a selective anisotropic etch process to said first semiconductor device, wherein said first gate electrode material is recessed such that a recessed first gate electrode material is left and a cavity structure is formed in alignment with said first gate structure in said first active region during said selective anisotropic etch process;
performing a deposition process for depositing a strain-inducing material in said cavity structure;
forming a first silicide portion on said first gate dielectric material by siliciding said recessed first gate electrode material; and
forming a second silicide portion by siliciding a portion of said second gate electrode material.

10. The method of claim 9, wherein said deposition process for depositing said strain-inducing material comprises one or more deposition and etch cycles.

11. The method of claim 10, wherein said deposition process is configured such that said growth rate of silicon/germanium after each deposition and etch cycle is positive on said cavity structure and negative on said first gate electrode material.

12. The method of claim 9, wherein said semiconductor device structure represents a CMOS structure with a PMOS device forming said first semiconductor device and an NMOS device forming said second semiconductor device.

13. A method of forming a semiconductor device structure, comprising:
forming a first semiconductor device with a first gate structure over a first active region formed in a semiconductor substrate, said first gate structure comprising a first gate electrode material and a first gate dielectric material;
forming a second semiconductor device with a second gate structure over a second active region formed in said semiconductor substrate, said second gate structure comprising a second gate electrode material and a second gate dielectric material;
forming a masking layer that covers the second semiconductor device and exposes the first semiconductor device;
with the masking layer in position, performing at least one etching process to recess said first gate electrode material, leaving a recessed, reduced thickness first gate electrode material; and
performing a common metal silicide formation process on both the first semiconductor device and the second semiconductor device so as to:
form a first silicide portion on and in contact with said first gate dielectric material by consuming substantially all of the recessed, reduced thickness first gate electrode material; and
forming a second silicide portion on and in contact with a portion of said second gate electrode material.

14. The method of claim 13, further comprising, prior to performing the common metal silicide formation process, removing the masking layer.

15. The method of claim 13, further comprising, prior to performing the common metal silicide formation process, forming a cavity structure in the first active region in alignment with said first gate structure and performing a deposition process to deposit a strain-inducing material in said cavity structure.

16. The method of claim 13, wherein further comprising forming a masking pattern over said semiconductor structure for exposing said first semiconductor device during said formation of said cavity structure and said deposition process, and masking pattern covering said second semiconductor device.

17. The method of claim 13, wherein performing the at least one etching process said comprises performing the at least one etching process so as to form a cavity structure in the first active region in alignment with said first gate structure.

18. The method of claim 13, wherein performing the at least one etching process comprises performing at least one anisotropic etching process.

\* \* \* \* \*

UNITED STATES PATENT AND TRADEMARK OFFICE
CERTIFICATE OF CORRECTION

PATENT NO.        : 9,349,734 B2
APPLICATION NO.   : 14/475720
DATED             : May 24, 2016
INVENTOR(S)       : Peter Javorka et al.

Page 1 of 1

It is certified that error appears in the above-identified patent and that said Letters Patent is hereby corrected as shown below:

In the Claims

Col. 9, line 20 (claim 1, line 13), delete ""pattern"" and insert therefor -- "patterned" --.

Col. 9, line 23 (claim 1, line 16), delete ""pattern"" and insert therefor -- "patterned" --.

Col. 9, line 31 (claim 1, line 24), delete ""pattern"" and insert therefor -- "patterned" --.

Col. 9, line 34 (claim 1, line 27), delete ""pattern"" and insert therefor -- "patterned" --.

Col. 11, line 9 (claim 16, line 5), delete ""and masking"" and insert therefor -- "said masking" --.

Signed and Sealed this
Twelfth Day of July, 2016

Michelle K. Lee
*Director of the United States Patent and Trademark Office*